United States Patent
Sekizaki et al.

(10) Patent No.: US 9,885,758 B2
(45) Date of Patent: Feb. 6, 2018

(54) VOLTAGE MONITORING DEVICE FOR ASSEMBLED BATTERY

(75) Inventors: Masashi Sekizaki, Makinohara (JP); Satoshi Ishikawa, Makinohara (JP); Kimihiro Matsuura, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 1375 days.

(21) Appl. No.: 12/794,200

(22) Filed: Jun. 4, 2010

(65) Prior Publication Data

US 2010/0308835 A1 Dec. 9, 2010

(30) Foreign Application Priority Data

Jun. 5, 2009 (JP) ................ P2009-135965

(51) Int. Cl.
- G01R 31/36 (2006.01)
- H02J 7/00 (2006.01)
- G01N 27/416 (2006.01)
- H01M 10/48 (2006.01)

(52) U.S. Cl.
CPC ...... G01R 31/3658 (2013.01); G01R 31/3689 (2013.01); H01M 10/482 (2013.01); H02J 7/0021 (2013.01); Y02T 10/7055 (2013.01)

(58) Field of Classification Search
CPC .................. G01R 31/3658; G01R 31/3689
USPC ................ 320/103, 104, 116, 120, 134
See application file for complete search history.

(56) References Cited

U.S. PATENT DOCUMENTS

| 6,563,291 | B2 * | 5/2003 | Tamura et al. | 320/116 |
| 6,762,588 | B2 * | 7/2004 | Miyazaki et al. | 320/116 |
| 7,471,064 | B2 * | 12/2008 | Sobue et al. | 320/116 |
| 7,511,457 | B2 * | 3/2009 | Emori et al. | 320/118 |

(Continued)

FOREIGN PATENT DOCUMENTS

| JP | 2002-084669 | 3/2002 |
| JP | 2009-089484 | 4/2009 |

OTHER PUBLICATIONS

English Abstract of JP 2002-084669 (1 page).

(Continued)

*Primary Examiner* — Drew A Dunn
*Assistant Examiner* — Tarikh Rankine
(74) *Attorney, Agent, or Firm* — Finnegan, Henderson, Farabow, Garrett & Dunner, LLP

(57) ABSTRACT

There is provided a voltage monitoring apparatus for monitoring an output voltage of an assembled battery. The voltage monitoring apparatus comprises: voltage monitoring sections, each section monitoring a voltage of each block of the plurality of blocks into which the plurality of unit cells are divided, wherein the voltage monitoring sections are connected one another through communication lines; and a control unit which is connected to the voltage monitoring section through the communication lines. The voltage monitoring section compares the respective detected voltages of the unit cells with the threshold voltage to determine a result of the comparison, and transmits the comparison result to the control unit. In a case where the threshold voltage is changed, the control unit transmits a registration signal indicating the changed threshold voltage, and when received the registration signal, the voltage monitoring section changes the stored threshold voltage to the changed threshold voltage.

5 Claims, 3 Drawing Sheets

(56) References Cited

U.S. PATENT DOCUMENTS

| | | | | |
|---|---|---|---|---|
| 7,528,581 | B2* | 5/2009 | Miyazaki et al. | 320/163 |
| 9,130,379 | B2* | 9/2015 | Sakabe | B60L 3/0046 |
| 2007/0139007 | A1* | 6/2007 | Lim et al. | 320/116 |
| 2008/0061740 | A1* | 3/2008 | Miyazaki et al. | 320/116 |
| 2008/0067978 | A1* | 3/2008 | Miyazaki et al. | 320/116 |
| 2009/0085516 | A1 | 4/2009 | Emori et al. | |
| 2009/0091297 | A1* | 4/2009 | Ishikawa et al. | 320/134 |

OTHER PUBLICATIONS

Japanese Office Action of Patent Application No. 2009-135965 dated Apr. 12, 2013 (2 pgs.), with English translation (2 pgs.).
Japanese Office Action of Patent Application No. 2009-135965 dated Jul. 26, 2013 (1 pg.), with English translation (2 pgs.).

* cited by examiner

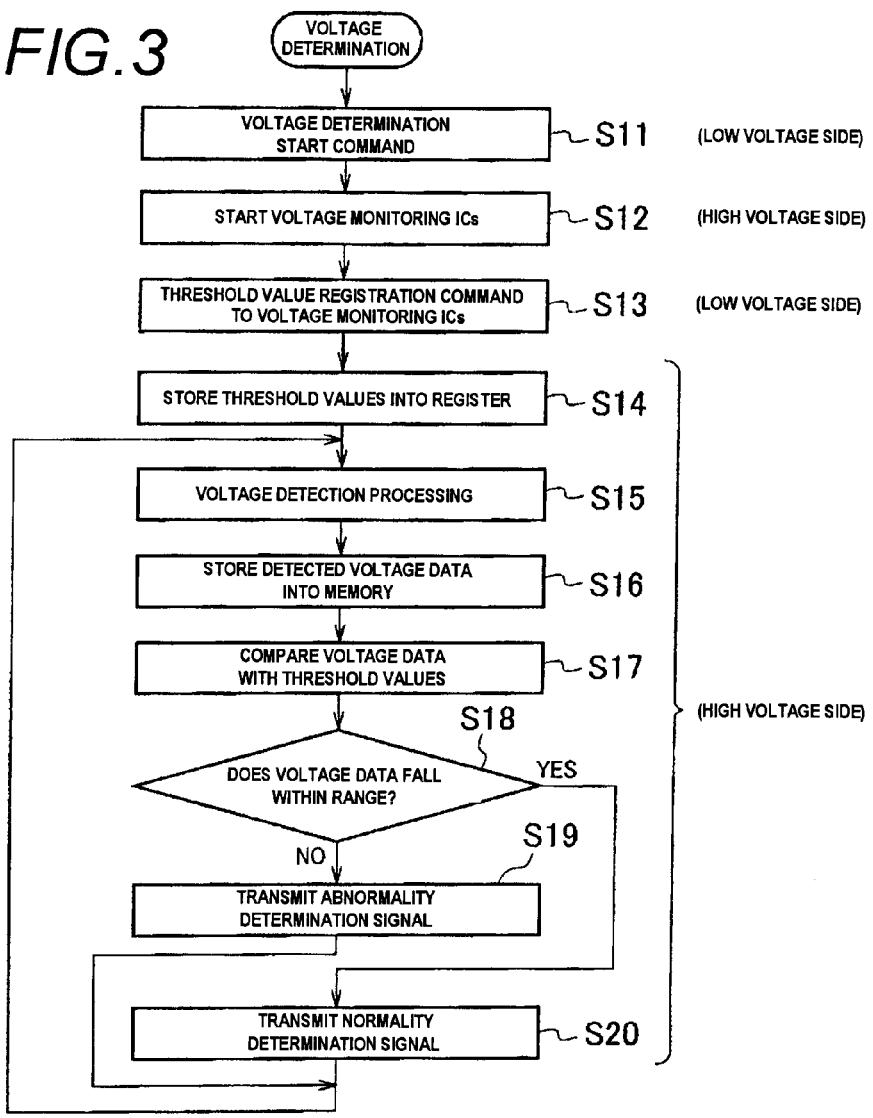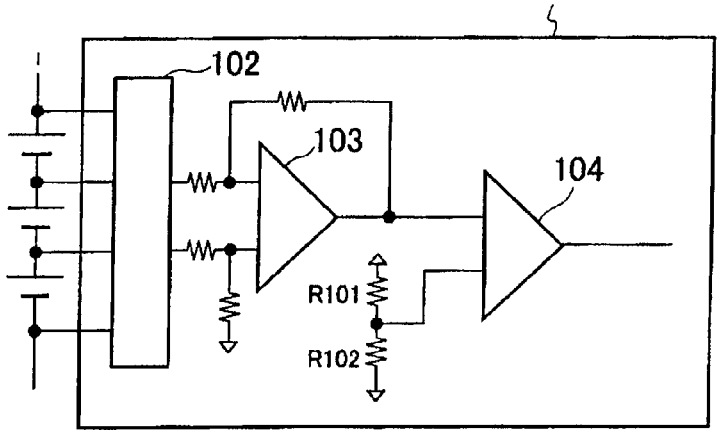

VOLTAGE MONITORING DEVICE FOR ASSEMBLED BATTERY

BACKGROUND OF THE INVENTION

1. Field of the Invention

The present invention relates to a voltage monitoring device for monitoring output voltages of an assembled battery in which a plurality of unit cells are connected in series so as to generate a desired voltage.

2. Background Art

For example, a hybrid vehicle has a high voltage battery serving as a driving power supply for the motor. In the high voltage battery, for example, a plurality of unit cells for secondary battery (storage battery) such as nickel-hydrogen battery cells and lithium battery cells are connected in series so as to provide a high voltage.

Further, in order that the secondary battery should be prevented from being overcharged or overdischarged, the charging state of each unit cell need to be checked. Thus, in the background art, a plurality (e.g., 55) of unit cells are divided into, for example, five blocks (i.e., each 11 unit cells corresponds to one block). Then, the voltages outputted from the unit cells of each block are measured in real time by an IC for voltage detection provided in each block. Then, it is determined whether the measured voltage of each unit cell falls within a predetermined range (see, for example, JP-A-2002-84669).

FIG. 4 is an explanation diagram showing an example of a voltage detection circuit used in a background art voltage monitoring device. In the voltage detection circuit 101, a switching circuit 102 selects a unit cell so as to provide its voltage to an amplifier 103. Then, a comparator 104 compares a voltage outputted from the amplifier 103 with a reference voltage generated by voltage division by resistors R101 and R102, and on the basis of this comparison result, determines whether the output voltage of the unit cell is not less than a predetermined upper limit threshold voltage or alternatively not more than a predetermined lower limit threshold voltage.

Nevertheless, in the background art voltage monitoring device, since the reference voltage is generated on the basis of the ratio of the resistors R101 and R102, when the upper limit threshold voltage or the lower limit threshold voltage used in detection of the voltage of each unit cell are to be changed, the ratio of the resistors R101 and R102 need be adjusted. That is, there must be much work and cost in the adjustment of the upper limit threshold voltage or the lower limit threshold voltage.

The threshold value for determining the upper limit voltage or the lower limit voltage of each unit cell is changed in some cases depending on the installation environment such as the ambient temperature or on the type of the secondary battery to be connected. Then, in such cases, the circuit configuration need to be changed. This causes much cost in changing the components and much work of replacing the components for the worker.

SUMMARY OF THE INVENTION

The present invention has been devised in order to resolve such a problem in the background art. An object of the present invention is to provide a voltage monitoring device for an assembled battery in which a threshold voltage for each unit cell can be changed by easy operation.

In order to achieve the above object, there is provided a voltage monitoring apparatus for monitoring an output voltage of an assembled battery in which a plurality of unit cells are connected in series, the voltage monitoring apparatus comprising: voltage monitoring sections, each section monitoring a voltage of each block of the plurality of blocks into which the plurality of unit cells are divided, wherein the voltage monitoring sections are connected one another through communication lines; and a control unit which is connected to the voltage monitoring section through the communication lines, wherein each of the voltage monitoring sections includes: a memory section for storing a threshold voltage therein; a voltage detection section which is configured to detect respective voltages of the unit cells in a corresponding block; a voltage comparison section which is configured to compare the respective detected voltages of the unit cells with the threshold voltage to determine a result of the comparison; and a communication section which is configured to transmit the determination result of the voltage comparison section to the control unit, in a case where the threshold voltage is changed, the control unit transmits a registration signal indicating the changed threshold voltage, and when received the registration signal, the communication section of each voltage monitoring section changes the threshold voltage stored in the memory section to the changed threshold voltage.

According to the configuration, the voltage monitoring sections are mutually connected through communication lines. Then, when a threshold voltage signal is transmitted from the control unit, the threshold voltage is stored into the memory section of each voltage monitoring section, and then the voltage of each unit cell detected by the voltage detecting section is compared with the threshold voltage. Accordingly, the threshold voltage is changed by easy operation without the necessity of complicated work such as the work of changing the hardware structure. Thus, the configuration is remarkably effective in a situation that the threshold voltage is changed, for example, depending on the installation environment of the high voltage battery or alternatively in accordance with the change of the type of the employed high voltage battery.

BRIEF DESCRIPTION OF THE DRAWINGS

In the accompanying drawings:

FIG. 3 is a flow chart showing a procedure of voltage determination processing performed by the voltage monitoring device according to the embodiment of the present invention; and FIG. 4 is an explanation diagram showing a method of setting a threshold voltage in the background art.

DETAILED DESCRIPTION OF THE EXEMPLARY EMBODIMENTS

Figure 1:
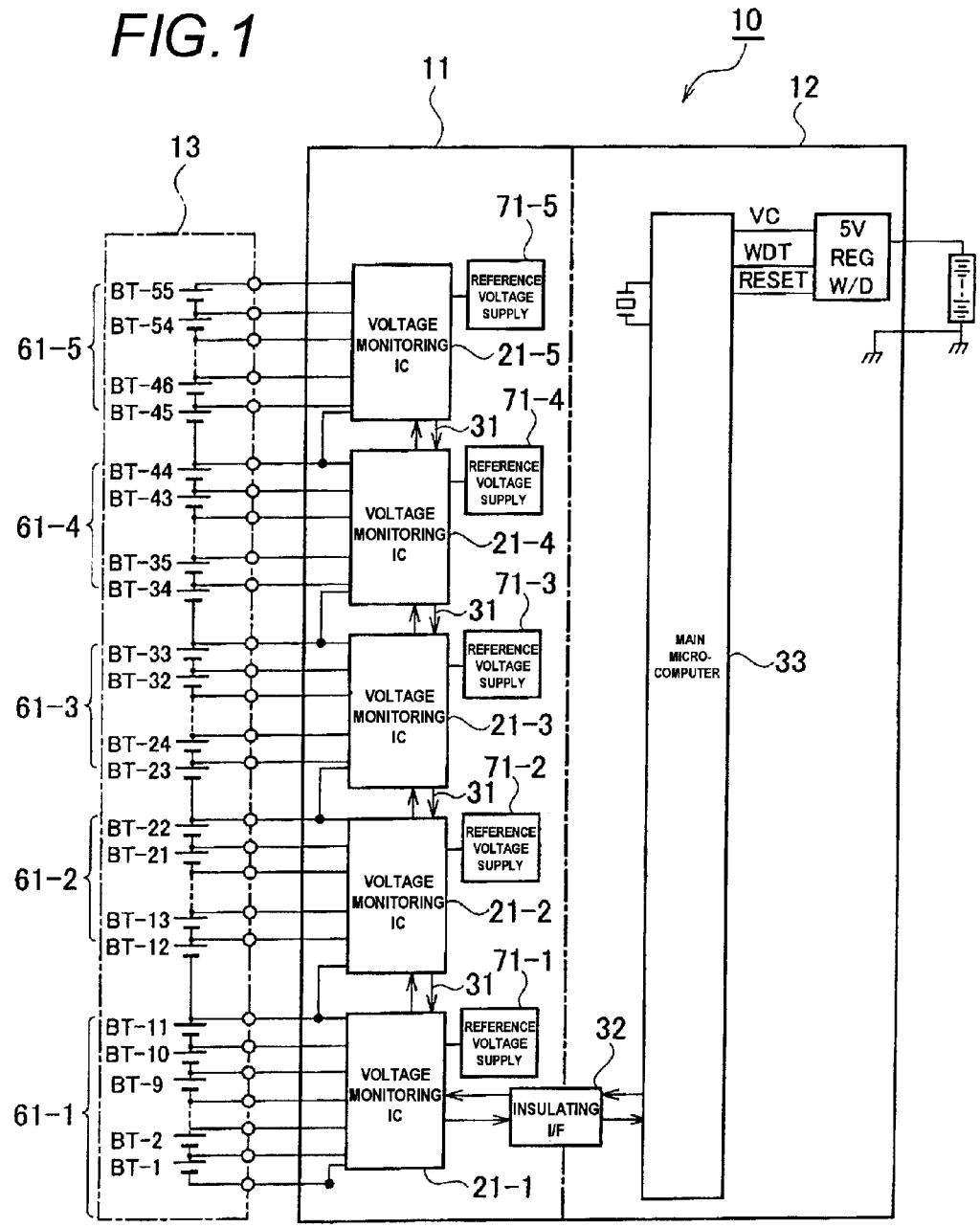
FIG. 1 is a circuit diagram showing a voltage monitoring device according to an embodiment of the present invention, together with a secondary battery.

There is provided a voltage monitoring apparatus for monitoring an output voltage of an assembled battery in which a plurality of unit cells are connected in series, the voltage monitoring apparatus comprising: voltage monitoring sections, each section monitoring a voltage of each block of the plurality of blocks into which the plurality of unit cells are divided, wherein the voltage monitoring sections are connected one another through communication lines; and a control unit which is connected to the voltage monitoring section through the communication lines, wherein each of the voltage monitoring sections includes: a memory section for storing a threshold voltage therein; a voltage detection section which is configured to detect respective voltages of the unit cells in a corresponding block; a voltage comparison section which is configured to compare the respective detected voltages of the unit cells with the threshold voltage to determine a result of the comparison; and a communication section which is configured to transmit the determination result of the voltage comparison section to the control unit, in a case where the threshold voltage is changed, the control unit transmits a registration signal indicating the changed threshold voltage, and when received the registration signal, the communication section of each voltage monitoring section changes the threshold voltage stored in the memory section to the changed threshold voltage.

According to the configuration, the voltage monitoring sections are mutually connected through communication lines. Then, when a threshold voltage signal is transmitted from the control unit, the threshold voltage is stored into the memory section of each voltage monitoring section, and then the voltage of each unit cell detected by the voltage detecting section is compared with the threshold voltage. Accordingly, the threshold voltage is changed by easy operation without the necessity of complicated work such as the work of changing the hardware structure. Thus, the configuration is remarkably effective in a situation that the threshold voltage is changed, for example, depending on the installation environment of the high voltage battery or alternatively in accordance with the change of the type of the employed high voltage battery.

The voltage monitoring apparatus may be configured in that the threshold voltage stored in the memory section includes an upper limit threshold voltage indicating an upper limit of the voltage of the unit cell and a lower limit threshold voltage indicating a lower limit of the voltage of the unit cell, and the voltage comparison section transmits, as the determination result to the control unit, that the voltage of the unit cell detected by the voltage detection section is smaller than the lower limit threshold voltage, is greater than the upper limit threshold voltage, or alternatively within a range between the lower limit threshold voltage and the upper limit threshold voltage.

According to the configuration, as the threshold voltages, the lower limit threshold voltage that indicates a lower limit voltage and an upper limit threshold voltage that indicates an upper limit voltage are set up. Then, when the output voltage of each unit cell falls between the lower limit threshold voltage and the upper limit threshold voltage, it is determined that the voltage is normal. This permits reliable detection whether the output voltage of each unit cell falls within the predetermined range.

The voltage monitoring apparatus may be configured in that the voltage comparison section transmits, as the determination result to the control unit, an abnormality determination signal when it is determined that the detected voltage of the unit cell is smaller than the lower limit threshold voltage, or is greater than the upper limit threshold voltage, and a normality determination signal when it is determined that the detected voltage of the unit cell is within the range between the lower and upper limit threshold voltages.

According to the configuration, when the output voltage of each unit cell falls between the lower limit threshold voltage and the upper limit threshold voltage, the normality determination signal is transmitted. Further, when the voltage is smaller than the lower limit threshold voltage or alternatively greater than the upper limit threshold voltage, the abnormality determination signal is transmitted. This reduces the amount of data in communication and the communication load.

The voltage monitoring apparatus may be configured in that the voltage monitoring apparatus is divided into a high voltage side device and a low voltage side device connected via an insulation interface to the high voltage side device, and the voltage monitoring sections are provided in the high voltage side device, and the control unit is provided in the low voltage side device.

According to the configuration, the control unit is provided on the low-voltage device side to which the voltage monitoring section provided on the high-voltage device side is connected with the insulating interface in between. This permits reliable separation between the high-voltage device and the low-voltage device.

Embodiment

Embodiments of the present invention are described below with reference to the drawings. FIG. 1 is a block diagram showing: a voltage monitoring device 10 according to an embodiment of the present invention; and a secondary battery 13 (an assembled battery) including a plurality of unit cells BT-1 to BT-55. The secondary battery 13 employed in the present embodiment is used, for example, as a high voltage battery for driving a motor in a hybrid vehicle or an electric vehicle.

As shown in FIG. 1, the voltage monitoring device 10 according to the present embodiment is divided into a high-voltage side device 11 and a low-voltage side device 12 with an insulating interface 32 in between.

The high-voltage side device 11 includes five voltage monitoring ICs, that is, a first voltage monitoring IC (21-1) to a fifth voltage monitoring IC (21-5). The first voltage monitoring IC (21-1) measures the output voltages of the eleven unit cells BT1 to BT11 grouped as a first block 61-1. Further, the second voltage monitoring IC (21-2) measures the output voltages of the eleven unit cells BT12 to BT22 grouped as a second block 61-2. Similarly, the third voltage monitoring IC (21-3) measures the output voltages of the eleven unit cells BT23 to BT33 grouped as a third block 61-3, the fourth voltage monitoring IC (21-4) measures the output voltages of the eleven unit cells BT34 to BT44 grouped as a fourth block 61-4, and the fifth voltage monitoring IC (21-5) measures the output voltages of the eleven unit cells BT45 to BT55 grouped as a fifth block 61-5.

Further, each of the voltage monitoring ICs (21-1 to 21-5) has an A/D converter 26 (see FIG. 2), and by using a reference voltage outputted from each of the reference power supplies 71-1 to 71-5 for A/D conversion, converts a voltage signal inputted from each unit cell provided in each block (the first block to the fifth block) into a digital voltage signal.

Further, the second to the fifth voltage monitoring ICs (21-2 to 21-5) are connected through communication lines 31 to the first voltage monitoring IC (21-1). Then, the first voltage monitoring IC (21-1) is connected through the insulating interface 32 to a main microcomputer (control unit) 33 provided on the low-voltage side device 12. That is, the main microcomputer 33 and the voltage monitoring ICs (21-1 to 21-5) are connected to each other by daisy chain communication through the insulating interface 32.

Figure 2:
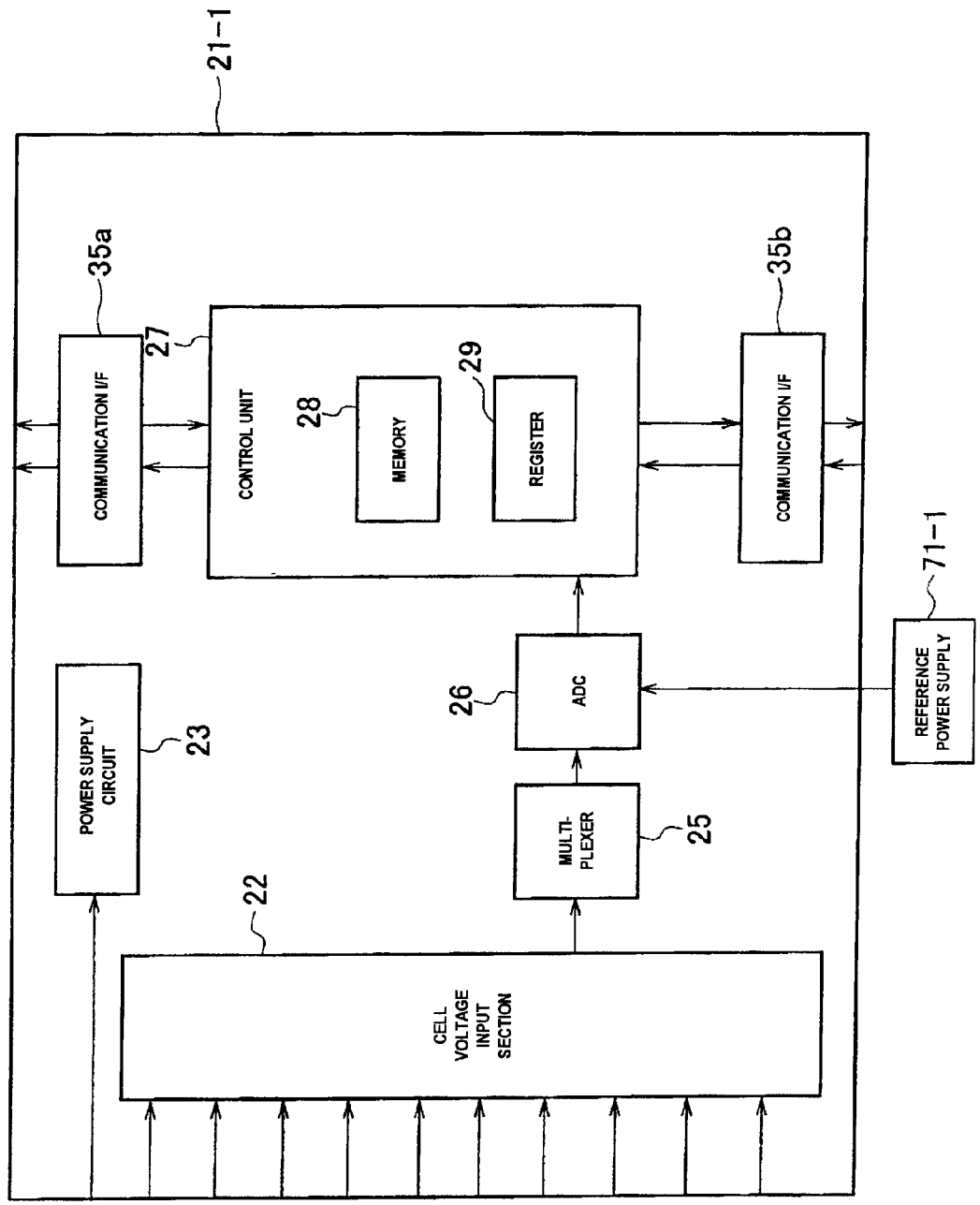
FIG. 2 is a block diagram showing a detailed configuration of the voltage monitoring device according to the embodiment of the present invention.

FIG. 2 is a block diagram showing the internal configuration of the first voltage monitoring IC (21-1). The detailed configuration of the first voltage monitoring IC (21-1) is described below with reference to FIG. 2. Here, the second to the fifth voltage monitoring ICs (21-2 to 21-5) have the same configuration as the first voltage monitoring IC (21-1). Thus, their detailed description is omitted.

As shown in FIG. 2, the first voltage monitoring IC (21-1) includes: a power supply circuit 23 for receiving the electric power outputted from a unit cell so as to generate a predetermined voltage; a cell voltage input section 22 connected to each of the unit cells BT1 to BT11 provided in the block 61-1 so as to detect each output voltage; a multiplexer 25 for converting into a serial signal the voltage signals of the individual unit cells outputted through the cell voltage input section 22; and an A/D converter 26 for converting into a digital signal the voltage signal of each unit cell outputted from the multiplexer 25. On the basis of the reference voltage outputted from the reference voltage supply 71-1, the A/D converter 26 converts the analog signal into a digital signal.

The first voltage monitoring IC (21-1) further includes a control section 27 and two communication I/Fs 35a and 35b.

The control section 27 has a memory 28 and a register 29 for data storage, and comprehensively controls the first voltage monitoring IC (21-1). In particular, when threshold voltage setting data is transmitted from the main microcomputer 33, the control section 27 executes the processing of writing the data into the register 29. For example, as threshold voltages, an upper limit threshold voltage Vmax that sets forth an upper limit for the output voltage of each unit cell and a lower limit threshold voltage Vmin that sets forth a lower limit are transmitted, these threshold voltages Vmax and Vmin are stored into the register 29.

Further, when the output voltage of each unit cell is inputted from the A/D converter 26, the control section 27 stores the inputted voltage value of the unit cell into the memory 28 and, at the same time, performs the processing of comparing the inputted voltage value with the upper limit threshold voltage Vmax and the lower limit threshold voltage Vmin stored in the register 29 and then transmitting the comparison result through the communication I/Fs 35a and 35b to the main microcomputer 33 shown in FIG. 1.

Next, voltage measurement processing executed by the voltage monitoring device 10 having the above configuration according to the present embodiment is described below reference to a flow chart shown in FIG. 3.

First, in the processing at step S11, the main microcomputer 33 in the low-voltage side device 12 outputs a voltage detection start command.

In the processing at step S12, the voltage monitoring ICs (21-1 to 21-5) provided in the high-voltage side device 11 are started.

In the processing at step S13, the main microcomputer 33 outputs a threshold value registration command signal to the voltage monitoring ICs (21-1 to 21-5). In this processing, the main microcomputer 33 transmits the data of the lower limit threshold voltage Vmin that sets forth a lower limit of each cell voltage and the data of Vmax that sets forth an upper limit. The values for these threshold voltages Vmin and Vmax may be set up when a user inputs desired numerical values through an external input device (not shown) or alternatively when data set up in advance is automatically selected and transmitted in accordance with condition setting.

In the processing at step S14, each of the voltage monitoring ICs (21-1 to 21-5) stores into the register 29 the upper limit threshold voltage Vmax and the lower limit threshold voltage Vmin transmitted from the main microcomputer 33.

In the processing at step S15, each of the voltage monitoring ICs (21-1 to 21-5) starts detection of the output voltage of each unit cell. In this processing, the output voltage of each unit cell is provided to the cell voltage input section 22, and then provided through the multiplexer 25 to the A/D converter 26. As a result, digitized voltage data is inputted to the control section 27.

In the processing at step S16, each of the voltage monitoring ICs (21-1 to 21-5) stores into the memory 28 the data of the output voltage of each unit cell detected in the processing at step S15.

In the processing at step S17, each of the voltage monitoring ICs (21-1 to 21-5) compares the output voltage of each unit cell stored in the memory 28 with the lower limit threshold voltage Vmin and the upper limit threshold voltage Vmax stored in the register 29.

In the processing at step S18, each of the voltage monitoring ICs (21-1 to 21-5) determines whether the output voltage of each unit cell is smaller than the lower limit threshold voltage Vmin, greater than the upper limit threshold voltage Vmax, or alternatively within the range between the lower limit threshold voltage Vmin and the upper limit threshold voltage Vmax. When it is determined that the output voltage of the unit cell is smaller than the lower limit threshold voltage Vmin or alternatively greater than the upper limit threshold voltage Vmax (NO at step S18), an abnormality determination signal is transmitted to the main microcomputer 33 in the processing at step S19. Further, when it is determined that the output voltage of the unit cell is within the range between the lower limit threshold voltage Vmin and the upper limit threshold voltage Vmax (YES at step S18), a normality determination signal is transmitted to the main microcomputer 33 in the processing at step S20.

As such, each of the voltage monitoring ICs (21-1 to 21-5) in the high-voltage side device 11 determines whether the output voltage of each unit cell is between the lower limit threshold voltage Vmin and the upper limit threshold voltage Vmax, and then the determination result is transmitted to the main microcomputer 33 in the low-voltage side device 12. Thus, when voltage abnormality occurs in the output voltage of each unit cell, this abnormality is recognized immediately.

As described above, in the voltage monitoring device for an assembled battery according to the present embodiment, the data of the lower limit threshold voltage Vmin and the upper limit threshold voltage Vmax set up by the main microcomputer 33 is transmitted to the voltage monitoring ICs (21-1 to 21-5) connected by daisy chain communication, so that the lower limit threshold voltage Vmin and the upper limit threshold voltage Vmax set up in the voltage monitoring ICs (21-1 to 21-5) are changed by software. This allows easy change of the threshold voltages.

Thus, for example, even when the threshold voltages need to be changed because the environment where the high voltage battery is installed has varied or alternatively because the type of the high voltage battery has been changed, the work of changing the hardware structure and the like is unnecessary in contrast to the background art. That is, the threshold voltages can be easily changed merely by input setup processing through the main microcomputer 33.

Further, the result of comparison of the output voltage of each unit cell with the lower limit threshold voltage Vmin and the upper limit threshold voltage Vmax is indicated by a signal selected from an abnormality determination signal and a normality determination signal. Then, this signal is transmitted to the main microcomputer 33. This reduces the amount of data of communication signals and the communication load.

The voltage monitoring device for an assembled battery according to the present invention has been described above with reference to the illustrated embodiments. However, the present invention is not limited to these embodiments. That is, the configuration of each section may be replaced by an arbitrary configuration having a similar function.

For example, as for the threshold voltages, the above-mentioned embodiment has been given for an exemplary case that the lower limit threshold voltage Vmin and the upper limit threshold voltage Vmax are set up as two threshold voltages. However, the present invention is not limited to this. That is, only one of the lower limit threshold voltage and the upper limit threshold voltage may be set up.

Further, two threshold voltages including a first lower limit threshold voltage and a second lower limit threshold voltage lower than former may be set up. Further, another two threshold voltages including a first upper limit threshold voltage and a second upper limit threshold voltage greater than the former may be set up. Then, when the output voltage of each unit cell is smaller than the first lower limit threshold voltage or alternatively greater than the first upper limit threshold voltage, a first alarm may be outputted. Further, when the output voltage of each unit cell is smaller than the second lower limit threshold voltage or alternatively greater than the second upper limit threshold voltage, a second alarm may be outputted.

The present invention is remarkably useful in monitoring the output voltage of a plurality of unit cells constituting a high voltage battery.

What is claimed is:

1. A voltage monitoring apparatus for monitoring an output voltage of an assembled battery in which a plurality of unit cells are connected in series, the voltage monitoring apparatus comprising:
    voltage monitoring sections, each section monitoring a voltage of each block of the plurality of blocks into which the plurality of unit cells are divided, wherein the voltage monitoring sections are connected to one another through communication lines; and
    a control unit which is connected to the voltage monitoring section through the communication lines, wherein each of the voltage monitoring sections includes:
        a memory section for storing a threshold voltage therein;
        a voltage detection section which is configured to detect respective voltages of the unit cells in a corresponding block;
        a voltage comparison section which is configured to compare the respective detected voltages of the unit cells with the threshold voltage to determine a result of the comparison; and
        a communication section which is configured to transmit the determination result of the voltage comparison section to the control unit,
    in a case where the threshold voltage is changed, the control unit transmits a registration signal indicating the changed threshold voltage, and
    when received the registration signal, the communication section of each voltage monitoring section changes the threshold voltage stored in the memory section to the changed threshold voltage, the voltage comparison section of each of the voltage monitoring sections compares the respective detected voltages of the unit cells with the changed threshold voltage to determine an abnormality in output voltage of the plurality of unit cells, and the communication section of each of the voltage monitoring sections transmits the determination result of the voltage comparison section to the control unit, wherein the determination result includes an abnormality determination signal or a normality determination signal, indicating a state of the output voltage of unit cells of the block corresponding to the voltage comparison section of each of the voltage monitoring sections.

2. The voltage monitoring apparatus according to claim 1, wherein the threshold voltage stored in the memory section includes an upper limit threshold voltage indicating an upper limit of the voltage of the unit cell and a lower limit threshold voltage indicating a lower limit of the voltage of the unit cell, and
    the voltage comparison section transmits, as the determination result to the control unit, that the voltage of the unit cell detected by the voltage detection section is smaller than the lower limit threshold voltage, is greater than the upper limit threshold voltage, or alternatively within a range between the lower limit threshold voltage and the upper limit threshold voltage.

3. The voltage monitoring apparatus according to claim 2, wherein the voltage comparison section transmits, as the determination result to the control unit, the abnormality determination signal when it is determined that the detected voltage of the unit cell is smaller than the lower limit threshold voltage, or is greater than the upper limit threshold voltage, and the normality determination signal when it is determined that the detected voltage of the unit cell is within the range between the lower and upper limit threshold voltages.

4. The voltage monitoring apparatus according to claim 1, wherein the voltage monitoring apparatus is divided into a high voltage side device and a low voltage side device connected via an insulation interface to the high voltage side device, and
    the voltage monitoring sections are provided in the high voltage side device, and the control unit is provided in the low voltage side device.

5. The voltage monitoring apparatus according to claim 1, wherein the control unit receives the determination result of the voltage comparison section from the communication section and detects a voltage abnormality in an output voltage of the plurality of unit cells.

* * * * *